United States Patent [19]

Baraton et al.

[11] Patent Number: 5,615,136
[45] Date of Patent: Mar. 25, 1997

[54] DIGITAL BUS SIMULATOR INTEGRATED IN A SYSTEM FOR AUTOMATICALLY TESTING ELECTRONIC PACKAGES EMBARKED ON AN AIRCRAFT

[75] Inventors: Jean-Yves Baraton, Pibrac; Jean-Pierre Rieusse, Verdun sur Garonne; Benjamin Sulmont, Toulouse, all of France

[73] Assignee: Aerospatial Societe Nationale Industrielle, Paris, France

[21] Appl. No.: 342,828

[22] Filed: Nov. 21, 1994

[30]  Foreign Application Priority Data

Nov. 22, 1993 [FR] France ................... 93 13930

[51] Int. Cl.$^6$ ................................................ G06F 13/00
[52] U.S. Cl. ........................................ 364/578; 395/800
[58] Field of Search ................................ 395/282, 283; 364/578

[56]  References Cited

U.S. PATENT DOCUMENTS

| | | | |
|---|---|---|---|
| 5,038,317 | 9/1991 | Callan et al. | 395/282 |
| 5,056,060 | 10/1991 | Fitch et al. | 395/823 |
| 5,111,450 | 5/1992 | Cooledge et al. | 371/29.5 |
| 5,175,536 | 12/1992 | Aschliman et al. | 340/825.04 |
| 5,243,273 | 9/1993 | McAuliffe et al. | 371/22.1 |
| 5,257,393 | 10/1993 | Miller | 395/800 |
| 5,263,149 | 11/1993 | Winlow | 395/500 |
| 5,349,685 | 9/1994 | Houlberg | 395/800 |
| 5,410,717 | 4/1995 | Floro | 395/500 |
| 5,440,697 | 10/1995 | Boegel et al. | 395/500 |
| 5,479,610 | 12/1995 | Roll-Mecak et al. | 395/183.01 |

OTHER PUBLICATIONS

Autotestcon 90. IEEE Systems Readiness Technology Conference, 21 Sep. 1990, San Antonio, TX, USA 269–273, XP 201785 Joe Beat ' ATE digital testing using a programmable microsequencer architecture.

*Primary Examiner*—Kevin J. Teska
*Assistant Examiner*—Matthew Loppnow
*Attorney, Agent, or Firm*—Michael N. Meller

[57]  ABSTRACT

The present invention relates to an integrated digital bus simulator system for automatically testing electronic packages embarked on an aircraft including a computer. This bus simulator is able to reconfigured under the control of the computer of the system by reconfigurating its hardware and software so as to simulate the digital buses used on the aircraft. The system includes a bus simulation module which is reconfigurable in accordance with the bus to be simulated and with the wired logic downloaded into this module so as to adapt the architecture of the hardware to the purpose of the bus to be simulated.

7 Claims, 3 Drawing Sheets

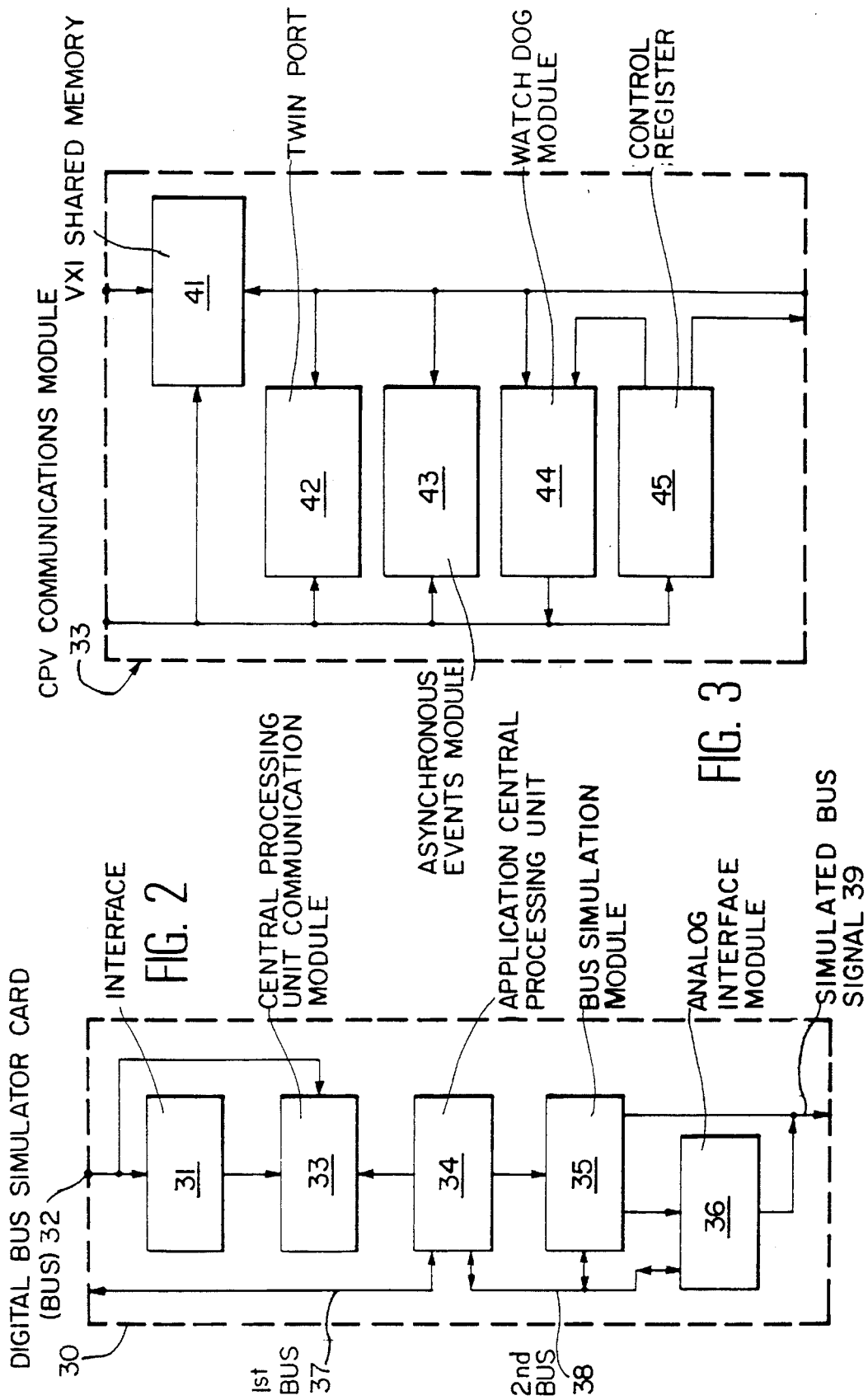

DIGITAL BUS SIMULATOR INTEGRATED IN A SYSTEM FOR AUTOMATICALLY TESTING ELECTRONIC PACKAGES EMBARKED ON AN AIRCRAFT

FIELD OF THE INVENTION

The present invention concerns a digital bus simulator integrated in a system for automatically testing electronic packages embarked on an aircraft.

BACKGROUND OF THE INVENTION

An aircraft contains various systems carrying out specific functions: weather radar, processing of flight parameters, electric generation, etc. These systems are composed of one or several electronic packages interconnected by communication links known as "Buses" and which in the aeronautical field are described by standards lodged at ARINC (Aeronautical Standardization office). Thus, for example, the standard ARINC 708 describes the weather radar system and the standard 717 describes the flight parameters acquisition system. Other buses comply with more general usage standards (for example, RS 232, 422 and 485 are standards published by the Electronic Industries Association), certain systems internally comprising buses particular to a package manufacturer.

A digital bus is thus a device for transmitting information between two systems. The information to be transmitted is digitized and may be represented by a series of 0's and 1's.

The digital buses mainly differ from one another via the following two characteristics:

the physical level which concerns the nature of the signals used and the way of coding binary information: for example, a condition 1 is represented by a voltage of 5 volts and a condition 0 by a voltage of 0 volts;

the protocol level which concerns additional information added to the initial message: these enable the recipient system to receive the initial information with the level of the desired security, for example the adding of a parity bit calculated from the transmitted binary information.

An automatic testing system intended to maintain electronic packages embarked on an aircraft is able to determine if a given package is operational and if the digital buses still observe their original specifications.

The following functions are required to verify the proper functioning of a bus:

generation of information on the bus in accordance with the protocol;

generation of information containing an error (non-observance of the protocol or tolerances concerning the signals) so as to check the proper functioning of the security of the system under test;

recording of information derived from the system being tested, said information being recovered by the computer of the automatic test system and analysed by the test program;

recording of protocol errors derived from the tested system;

generation of synchronization signals so as to carry out measurements relating to an event on the bus.

In order to maintain a fleet, an airline company needs to have this automatic test system. A system of this type shall be able to recreate around the package to be tested an environment identical to the one existing on the aircraft.

In order to test the packages embarked on an aircraft and connected by digital buses complying with different standards, the automatic test systems of the prior art are constituted by integrating a large number of simulation instruments, each being dedicated to a bus standard.

However, these systems have a large number of drawbacks and in particular:

the multiplication of the number of simulation instruments is expressed by an increase of the cost of the test system (each instrument has its own production cost);

the reliability and availability rate of the system deteriorates if the number of instruments increases;

a test system confronted during its functional life with the appearance on the market of new packages having buses not covered by the initial instruments shall of necessity integrate an additional instrument;

the size of the test system is encumbered by the amount of instruments.

The invention concerns a digital bus simulator integrated in an automatic test system able to carry out with a single instrument the simulation of various types of the digital buses of an aircraft.

SUMMARY OF THE INVENTION

To this effect, the present invention offers a bus simulator integrated in a system for automatically testing electronic packages embarked on an aircraft including a computer, wherein it is able to be reconfigured under the control of the computer of the system by reconfiguring its hardware and software so as to simulate the digital buses used on the aircraft.

The software and hardware are preferably downloaded. Moreover, the bus simulator of the invention appears in the form of a single instrument.

This instrument preferably comprises an electronic card provided with two microprocessors, several memory banks and reconfigurable logic circuits. The first microprocessor ensures communication with the computer of the test system by observing the communication protocols; the second microprocessor ensures the management of the used bus by executing the applicative software downloaded into the first memory; a first interface receives the system bus signals or VXI; a similar second interface is able to deliver simulated bus signals. Downloaded into the volatile-memory configurable circuits are wired logic automata required to simulate the bus. The second memory is accessible via the second microprocessor and the automata. The logic required to embody the control of this second memory is also implemented in a reconfigurable logic circuit.

The digital bus simulator of the invention is thus a simulation instrument able to be reconfigured under the control of the computer of the automatic test system (reconfiguration of its hardware and software) so as to simulate a large number of digital buses used on the aircraft.

The simulator of the invention is able to carry out with a single instrument the simulation of several different buses (several different standards can be simulated by the instrument).

By only producing a single instrument, the cost of the system is optimized, as well as its spatial requirement. The reliability of the system is improved and maintenance is facilitated: replacements no longer concern a single instrument.

The simulator of the invention can be adapted to new bus standards by merely modifying the reconfiguration information downloaded by the computer of the system, this intervention being without any common measurement with the integration of an additional simulation instrument.

In one advantageous embodiment example, the simulator of the invention includes:

A VXI bus interface module embodying the hardware interfacing with a VXI bus;

a central unit communications module comprising the circuits authorizing exchanges of information between the two processors of the simulator and with the controller of the VXI bus;

an application central unit carrying out the configuration and operational functions of the buses to be simulated;

a bus simulation module which autonomously carries out the transmission and receiving functions on the simulated buses, as well as the function for storing the exchanged information, this functional module being reconfigurable according to the buses to be simulated;

an analog interface module embodying the analog material adaptation of the buses;
one first bus carrying the hardware triggering signals between the VXI bus and the application central processing unit, a second bus carrying the hardware triggering signals between the application central processing unit, the bus application simulation module and the analog interface module.

The central processing unit communications module comprises:
a VXI shared memory;
a double port shared memory;
an asynchronous events module;
a "watchdog" module;
a control register.

This module containing the hardware elements allows for the exchange of information between the VXI bus, the VXI interface module and the application central processing unit.

The application central processing unit includes:
a central processing unit;
a local working memory;
a programmable variable clock module;
a module for processing exceptions;
a system clock module and various ports;
a hardware triggering signal management module connected to the first and second buses,
one output of this central processing unit being connected to the central processing unit communications module and another output being connected to the bus application simulation module, this application central processing unit providing the material resources required for exploiting the bus simulators, as well as the bus processor which ensures the exploitation of the simulated buses.

The digital bus simulation module comprises all the hardware required to autonomously carry out information exchanges on the simulated buses and includes:
a bus insolation module, LCA bus decoding, and simulator registers;
A DMA controller and dating clock module;
a reconfigurable bus simulation module;
an exchange memory;
a data bus translator module;
specialized peripheral units;
line adaptation circuits;
the inputs and outputs of this module being connected respectively to the application central processing unit, the second bus of the material triggering signals and to the analog interface card, the final output delivering the simulated bus signals.

BRIEF DESCRIPTION OF THE DRAWINGS

FIGS. 2 to 5 illustrate an embodiment example of the digital bus simulator of the invention.

DETAILED DESCRIPTION OF THE PREFERRED EMBODIMENTS

Figure 1:
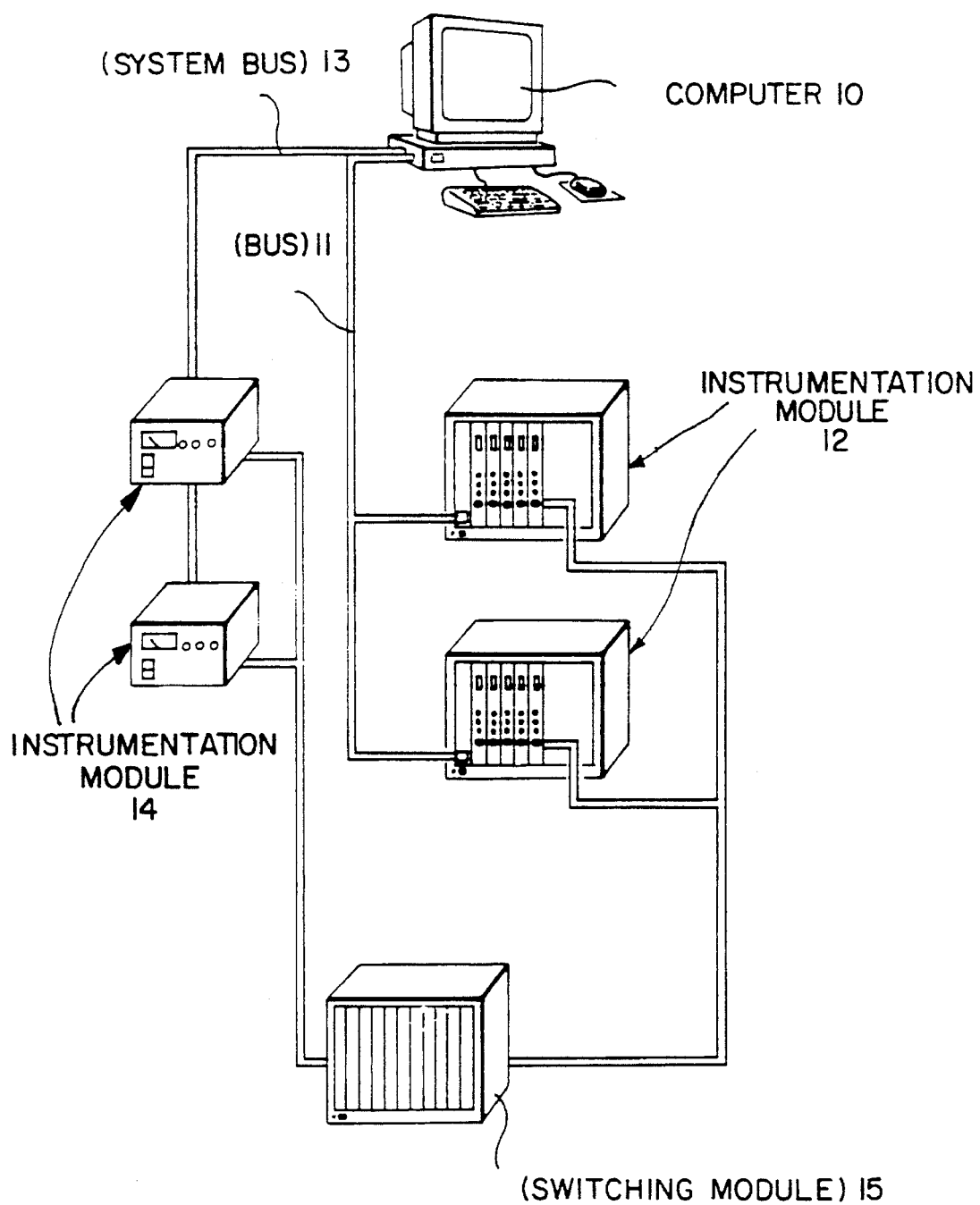
FIG. 1 illustrates an automatic test system of the prior art.

As shown on FIG. 1, an automatic test system includes in particular:

a computer 10: this computer is provided with a software which makes it possible to develop and execute the test programmes. It is connected to the instrumentation it controls via one or several system buses;

system buses 11, 13: the computer 10 of the test system communicates with the instrumentation 12, 14 via several buses, for example via the following buses:
an MXI 11 bus: bus developed by National Instrument and designed to interconnect several VXI 12 chassis and with various types of computers,
an IEEE 488 13 bus: standard bus to communicate with the instrumentation 14;

instrumentation modules 12, 14: the instruments integrated on the test system for the most part comply with the VXI standard (extension of the VME bus for the instrumentation). These instruments appear in the form of electronic cards or possibly in the traditional form of laboratory instruments;

a switching module 15: the switching complies for example with the ARINC 608 standard; it is able to switch the signals derived from the package under test towards the instrumentation of the system.

The automatic test system defined above comprises a digital bus simulator.

The various digital buses used on an aircraft differ by virtue of the physical characteristics of the signal (voltage, frequency . . .) and by the protocol used (setting up of binary information frames). Certain characteristics can be controlled by a microprocessor; the frames of the ARINC 708 system are, for example, generated with a time interval of 7.82 ms. For these characteristics, the adaptation to a new type of bus assumes that the applicative software of the instrument be changed depending on the bus to be simulated. Certain characterstics can be controlled by a wired logic automaton (for example, the binary information present on the WXR bus is emitted at a flow of eight million pieces of information per second). For these characteristics, the adaptation to a new type of bus assumes that the wired logic of the automaton be changed.

According to the invention, the digital bus simulator, as shown on FIG. 2, comprises an electronic card 30 provided with two microprocessors, several memory banks and reconfigurable logic circuits.

The first microprocessor is integrated in an interface module 31. The second microprocessor is integrated in a central processing unit module 34. The memory banks are distributed in the interface module 31 and in the central processing unit communication module 33, the application central processing unit 34 module and the bus simulation module 35.

The first microprocessor ensures communication with the computer of the test system by observing the communication protocols, such as those defined by the VXI standard.

The second microprocessor ensures management of the buses used by executing the applicative software downloaded into a first memory.

The first module 31 receives the signals from a bus 32, for example a VXI type bus. An analog interface module 36 is able to deliver simulated bus signals 39.

Wired logic automata required to simulate the bus are downloaded into the module 35. They may, for example, be of the FPGA (Field Programmable Gate Array) type able to be configured by a volatile memory (LCA component, that is "Logic Cell Array" produced by XILINX).

A second memory is accessible by the second microprocessor. The automata are wired logic automata. The logic required to control this memory (DMA circuit) is also implemented in a reconfigurable logic circuit. This reconfiguration of the internal management mechanisms of the bus simulator is required so as to be adapted to the speed requirements specific to each simulated digital bus. (For example, when the bus simulator is used for several RS 232 buses, it is necessary to download a DMA circuit able to manage 8 channels with a cycle time of 800 nanoseconds. When the bus simulator is used to simulate a WXR bus, it is necessary to download a DMA circuit with a cycle time of 200 ns).

The architecture of the digital bus simulator is able to download into the latter the applicative software and the wired logic of the automata able to simulate a new digital bus.

Advantageously, the digital bus simulator of the invention is a card complying with the VXI standard (VMEbus Xtensions for instrumentation) able to simulate the digital buses RS 232, RS 422, RS 485, ARINC 708, ARINC 717, DSDL, WXR, IO discreet on two channels simulataneously.

So as to embody a wired logic automaton on an electronic card, there are a large number of means available: for example, via an assembling of packages ensuring the elementary logic functions and connect these packages by the tracks of the printed circuit.

As integration requirements are currently increasing, there is also a search to integrate this logic inside PAL, GATE ARRAY, FPGA or ASIC type circuits. All these families of integrated circuits are intended to allow for the integration of a logic function defined by the user. These circuits differ by the complexity of the function able to be integrated (number of equivalent gates), the speed of operation, and the "programming" mode making it possible to "etch" the function in the integrated circuit (example: for the most complex, namely the ASICS, it is necessary to use a silicon founder).

FPGA type volatile memory-configurable integrated circuits are structured as follows. They have configurable logic blocks and means to interconnect these blocks. Moreover, they possess a configuration memory whose contents determine the logic equations of each block, the links between blocks and the links with the inputs and outputs of the circuit. Thus, it is possible to establish correspondence between the contents of the configuration memory and a logic function (automaton) filled by the integrated circuit.

For the moment, it is assumed that the automatic test system containing the bus simulator of the invention is implemented: the computer of the automatic test system executes a test program. This program implements the simulation of a particular digital bus. The computer contains in its bulk memory a set of files. Each file represents the contents of the configuration memory of the FPGA circuit and is associated with an automaton. Depending on the bus to be simulated, the computer establishes the configuration of the bus simulator with the corresponding set of files.

A protocol for communication between the bus simulator and the computer of the test system is defined so that this file is communicated to the microprocessor of this sub-system which is in direct relation with the FPGA circuit. This microprocessor receives the order to configure the FPGA circuit; it then carries out a specific sequence on downloading (this sequence is described in the documentation of the component). It uses the inputs and outputs of the FPGA circuit provided for this function and transfers the data of the file into the configuration memory. When all the data has been transferred, the FPGA circuit passes into the operational mode and fulfils on its outputs and inputs the logic function defined by its configuration memory.

In the embodiment example shown on FIG. 2, the digital bus simulator of the invention is composed of several modules:

a VXI bus interface module 31 which embodies the hardware interfacing with a VXI bus 32. This module is embodied around a DT9150 module from the Interface Technology manufacturer which is provided with a 68000 microprocessor;

a central processing unit module 33 which comprises the circuits authorizing the exchange of information between the two processors of the simulator and with the controller of the VXI bus;

an application central processing unit 34 which is architectured around a 68020 microprocessor, this module carrying out the functions for configuring and exploiting the buses to be simulated;

a bus simulation module 35 which autonomously carries out the emission and receiving functions on the simulated buses and the function for storing the exchanged information; this functional module can be reconfigured depending on the buses to be simulated;

an analog interface module 36 which carries out the analog hardware adaptation of the A717, A708, WXR and DSDL buses. It consists of a card connected to the main card of the bus simulator by means of several connectors.

A first bus 37 known as a "TTL Trigger" bus, carries the hardware triggering signals between the VXI bus and the application central processing unit 34.

A second bus 38, known as a "Trigger" bus, carries the hardware triggering signals between the application central processing unit 34, the bus application simulation module 35 and the analog interface module 36.

As shown on FIG. 3, the central processing unit communications module 33 comprises:

a VXI shared memory 41 of 64 K×16 bits;

a twin port shared memory 42 of 2 K×16 bits;

an asynchronous events module 43 (based, for example, on a 68901 type circuit);

a "watchdog" module 44, for example a MAX 699 CPA circuit;

a control register 45 (initialization of the central processing unit module 34, management of the "watchdog").

This module 33 contains the hardware elements allowing for the exchange of information between the VXI bus, the VXI interface module and the application central processing unit.

Figures 4, 5:
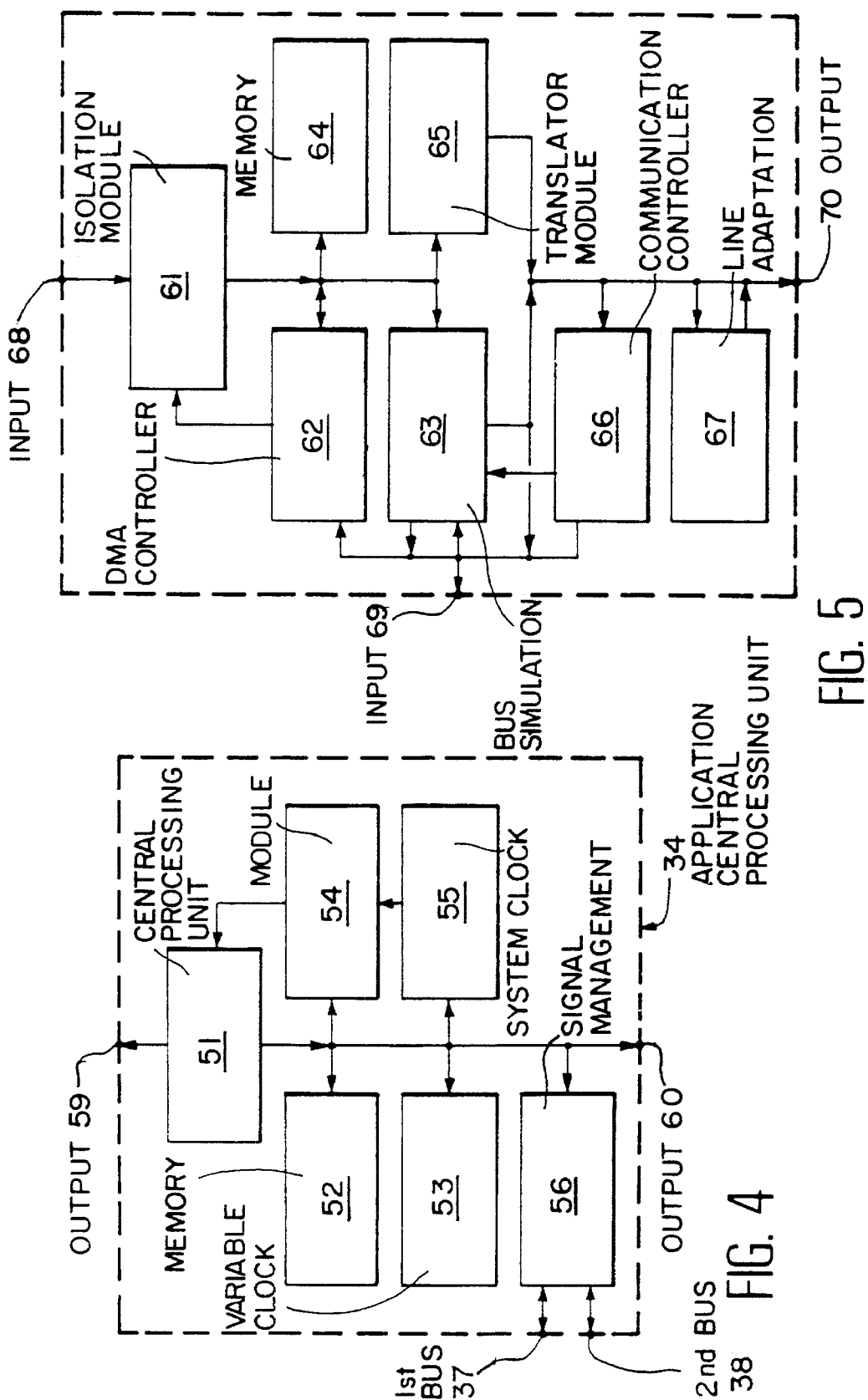

The application central processing unit shown on FIG. 4 includes:

a central processing unit 51 (for example, a 68020 type microprocessor) and its decoding logic (based on PAL 22V10);

a local working memory 52 of 256 K×32 bits;

a programmable variable clock module 53 (for example, a FPGA XC3090 circuit associated with voltage-controlled oscillators);

a module 54 for processing exceptions;

a system clock module 55 and various ports based on an MC 68901 circuit;

a hardware triggering signal management module 56 (for example, an FPGA XC 3090 circuit) connected to two buses: to the first "TTL Trigger" bus 37 and to the second "Trigger" bus 38.

The output 59 is connected to the central processing unit communications module 33 and the output 60 is connected to the bus application simulation module 35.

This application central processing unit furnishes the material resources required for exploiting the bus simulators, as well as the bus processor which ensures the exploitation of the simulated buses.

The digital bus simulation module 35 shown on FIG. 5 comprises all the hardware required to autonomously carry out the exchanges of information on the simulated buses (without the intervention of the 68020 microprocessor).

It includes:

a bus isolation module 61, LCA bus decoding and simulator registers;

a dating clock and DMA controller module 62, for example a FPGA XC4005 circuit;

a reconfigurable bus simulation module 63, for example two FPGA XC4005 circuits;

an exchange memory 64 of 256 K×32 bits;

a data bus translator module 65;

specialized ("Serial Communication Controller") peripherals 66, for example ZC 16C30;

line adaptation circuits 76 (RS, input/output).

Its inputs and outputs 68, 69 and 70 are respectively connected to the application central processing unit module, the "Trigger" bus and to the analog interface card, the latter output delivering the simulated bus signals.

This module has been designed from three reconfigurable circuits, one circuit providing the DMA controller function, the other two being configured independently for managing the buses to be simulated. It comprises a memory receiving the information exchanged on the simulated buses and two specialized circuits for management of the RS 232 type buses.

The circuits of this module are interfaced to a bus controlled by the DMA circuit as soon as the latter has been configured. The simulation automata of the buses ask the DMA circuit to ensure the transfer of data, both on emission and on reception. Then the automaton autonomously ensures coupling to the simulated bus.

The programming of the parameters required for each automaton for managing the simulated bus is ensured by the application central processing unit which asks the DMA circuit to control the bus in order to carry out these operations.

What is claimed is:

1. Digital bus simulator integrated in a test system for automatically testing electronic devices embarked on a suitable aircraft so as to simulate the digital buses used on the aircraft, which is reconfigured under the control of a computer for the test system by reconfiguring the test system software and hardware, this reconfiguration being required so as to be adapted to digital interface, coding, protocol and the speed requirements specific to each simulated digital bus, and the architecture of which is able to download into the latter the applicative software and the wired logic of the automata able to simulate a new digital bus; comprising:

at least a first and second processor, at least a first and second memory bank and reconfigurable logic circuits, wherein
the first processor ensures communication with the computer for the test system by observing the communication protocols,
the second processor ensures management of the buses used by executing the applicative software to be downloaded into said first memory for each simulated digital bus;
with the second memory bank being accessible by the second processor and with the logic required to control this memory bank being implemented in a reconfigurable logic circuit;

a bus interface module embodying the hardware interfacing for each digital bus on said aircraft and for receiving signals from said bus; the first processor being integrated in this module;

a central processing unit communications module comprising the circuits for authorizing exchanges of information between said first and second processor and with a controller for said bus, with the second processor being integrated in this module;

an application central processing unit for carrying out the configuration and operational functions of each digital bus to be simulated;

a bus simulation module which autonomously carries out exchange of information on the simulated bus, with said simulation module being reconfigurable according to the bus to be simulated with wired logic automata downloaded into this module so as to adapt the architecture of the hardware to the purpose of the bus to be simulated; and an analog interface module embodying the analog material adaptation for the simulated bus for delivering simulated bus signals.

2. Simulator according to claim 1 and appearing in the form of a single instrument.

3. Simulator according to claim 2 wherein the single instrument comprises an electronic card.

4. Simulator according to claim 3, wherein wired logic automata required to carry out bus simulation are downloaded into volatile-memory configurable circuits.

5. Simulator according to claim 1, wherein the central processing unit communications module comprises:

a VXI shared memory;

a double port shared memory;

an asynchronous events module;

a "watchdog" module;

a control register, this module containing the hardware elements allowing for the exchange of information between the VXI bus, the VXI interface module and the application central processing unit.

6. Simulator according to claim 1, wherein the application central processing unit includes:

a central processing unit;

a local working memory;

a programmable variable clock module;

a module for processing exceptions;

a system clock module and various ports;

a hardware triggering signal management module connected to the first and second buses, one output of this central processing unit being connected to the central processing unit communications module and another output being connected to the bus application simulation module, this application central processing unit providing the material resources required for exploiting the bus simulators, as well as the bus processor which ensures the exploitation of the simulated buses.

7. Simulator according to claim 1, wherein the digital bus simulation module comprises all the hardware required to autonomously carry out exchanges of information on the simulated buses and includes:

a bus isolation module, LCA bus decoding, and simulator registers;

A DMA controller and dating clock module;

a reconfigurable bus simulation module;

an exchange memory;

a data bus translator module;

specialized peripheral units;

line adaptation circuits;

the inputs and outputs of this module being connected respectively to the application central processing unit, the second bus of the material triggering signals and to the analog interface card, the final output delivering the simulated bus signals.

* * * * *